United States Patent [19]

Dody et al.

[11] Patent Number: 4,942,405

[45] Date of Patent: Jul. 17, 1990

[54] LIGHT EMITTING DIODE PRINT HEAD ASSEMBLY

[75] Inventors: Jospeh W. Dody, Mountain View; Richard J. Klinke, Sunnyvale; Christopher A. Lowery, Fremont; Vera D. Vallentin-Price, Sunnyvale; Gary D. Sasser; William P. Sullivan, both of San Jose, all of Calif.

[73] Assignee: Hewlett-Packard Company, Palo Alto, Calif.

[21] Appl. No.: 256,001

[22] Filed: Oct. 11, 1988

[51] Int. Cl.[5] .......................... G01D 9/42; G01D 9/00; H01L 27/15; H01L 33/00

[52] U.S. Cl. .................................. 346/107 R; 357/17; 357/45; 313/500; 346/1.1

[58] Field of Search ..................... 346/1.1, 107 R, 160; 357/17, 45; 29/729; 313/500; 340/782

[56] References Cited

U.S. PATENT DOCUMENTS

| | | | |
|---|---|---|---|
| 3,952,311 | 4/1976 | Lapeyre | 346/107 R |
| 4,536,778 | 8/1985 | De Schamphelaere et al. | 346/107 R |
| 4,566,170 | 1/1986 | Dolan | 357/17 |
| 4,605,944 | 8/1986 | Ishii et al. | 357/17 |
| 4,633,280 | 12/1986 | Takasu | 357/17 |
| 4,653,895 | 3/1987 | Deguchi et al. | 346/107 R |

FOREIGN PATENT DOCUMENTS 2099221B 12/1982 United Kingdom .

*Primary Examiner*—Bruce A. Reynolds
*Assistant Examiner*—Scott A. Rogers
*Attorney, Agent, or Firm*—Douglas A. Kundrat

[57] ABSTRACT

This technique for assembling a print head for an LED printer has LED dice first assembled into precisely known locations on mounting tiles. A portion of the front face of each tile is left exposed beyond anything mounted on the tile. The tiles are then assembled with these exposed areas on a planar reference on an assembly fixture. Reference surfaces built into the fixture align the edges of the tiles, and hence the LED dice. Finally a mother plate is adhesively bonded onto the backs of the tiles. The adhesive accommodates thickness variations in the mounting tiles, and lack of flatness in the back surfaces of the tiles and the front face of the mother plate. Reference tiles copolanar with the reference plane formed by the front faces of the mounting tiles provide a z axis reference.

13 Claims, 3 Drawing Sheets

LIGHT EMITTING DIODE PRINT HEAD ASSEMBLY

BACKGROUND

It has become desirable to employ non-impact printers for text and graphics. Xerographic techniques are employed in such non-impact printers. An electrostatic charge is developed on the surface of a moving drum or belt and selected areas of the surface are discharged by exposure to light. Alternatively, areas may be charged by illumination. A printing toner is applied to the drum and adheres to the areas having an electrostatic charge and does not adhere to the discharged areas. The toner is then transferred to a sheet of plain paper and is heat-fused to the paper. By controlling the areas illuminated and the areas not illuminated, characters, lines and other images may be produced on the paper.

One type of non-impact printer employs an array of light emitting diodes (LEDs) for exposing the photoreceptor drum surface. A line of minute LEDs is positioned next to a lens so that the images of the LEDs are arrayed across the surface to be illuminated. In some printers, multiple rows of LEDs may be used. As the surface moves past the line of LEDs, the LEDs are selectively activated to either emit light or not, thereby exposing or not exposing the surface of the drum in a pattern corresponding to the LEDs activated.

To obtain good resolution and image quality in such a printer, the physical dimensions of the LEDs must be quite small and very tight position tolerances must be maintained. Dimensional tolerances are often no more than a few tens of micrometers.

At the lowest level of integration, a plurality of light emitting diodes are formed on gallium arsenide chips or dice by conventional techniques. The size and positions of the LEDs are controlled by well-established photolithographic techniques. The wafer on which the LEDs are formed is carefully cut into individual dice, each having a row of LEDs. In an exemplary embodiment, the length of such a die is cut to $\pm 2$ micrometers and the width is cut to $\pm 5$ micrometers. An exemplary die about 8 millimeters long may have 96 LEDs along its length.

Practical problems arise in arranging these LED-bearing dice in a line with the necessary precision for good image quality. Clearly economical as well as precise assembly techniques are important.

For purposes of exposition herein, the face of the LED die on which the LEDs are formed is referred to as the front and the opposite face as the back. The same nomenclature is used for the other parts of the assembly such as integrated circuit chips, mounting tiles and the like. In each case, the face facing in the same direction as the LEDs is referred to as the front.

It is also convenient to employ a coordinate system for the assembly. Thus, the x direction is along the line of LEDs. The y direction is in the plane of the LEDs perpendicular to the x direction. The z direction is normal to these and is the direction in which the light output from the LEDs is generally directed. It might be thought of as the height.

In an exemplary embodiment, a print-head with a length corresponding to the width of a sheet of business size paper has 2592 light emitting diodes. Close control of dimensions between adjacent LEDs is more significant than the total length of the array since the user is more sensitive to a line displacement or character imperfection in mid-page than a discrepancy in the total page width. Spacing of LEDs on a die is well controlled by photolithography. The spacing between LEDs at the ends of adjacent dice is an area of concern in assembling an !ED print head. Typical tolerance between adjacent LEDs at the ends of dice can be as little as $\pm 10$ micrometers in the x direction.

Similarly, the tolerance in the y direction may be $\pm 25$ micrometers at the ends of adjacent dice, with a total "waviness" along the entire print-head of $\pm 75$ micrometers. Tolerance in the z direction may be $\pm 25$ microns to assure that light from the LEDs is sharply focused on the photo-receptor surface throughout the full length of the array.

It is desirable to provide a technique for rapidly and economically assembling a print-head having a line of LEDs that is substantially straight and co-planar. Tight control of dimensional tolerances is important. It is important that the chances for operator error be reduced to a minimum and to provide for intermediate testing of components as the array is assembled for a maximum yield of the final product.

BRIEF SUMMARY OF THE INVENTION

There is, therefore, provided in practice of this invention according to a presently preferred embodiment, a rigid metal mother plate on the front face o f which a plurality of metal tiles are secured with electrically conductive adhesive. Each of the tiles has an exposed area on its front face along each of two opposite lateral edges extending beyond anything secured on the front face of the tile. The exposed areas on the front faces of all of the tiles are fixed in a predetermined reference plane by assembling the tiles in a fixture having a planar reference surface. One lateral edge of all of the tiles is aligned along a predetermined straight line since the assembly fixture has a straight surface against which the edges of the tiles are abutted during assembly. A plurality of LED dice are secured in a row on the front face of each tile at a predetermined distance from the edge by assembly in a subassembly fixture. Thus, the rows of LED dice on adjacent tiles are aligned and the faces of the dice are substantially co-planar.

BRIEF DESCRIPTION OF THE DRAWINGS

These and other features and advantages of the present invention will be appreciated as the same becomes better understood by reference to the following detailed description when considered in connection with the accompanying drawings wherein.

DETAILED DESCRIPTION

Figure 1:
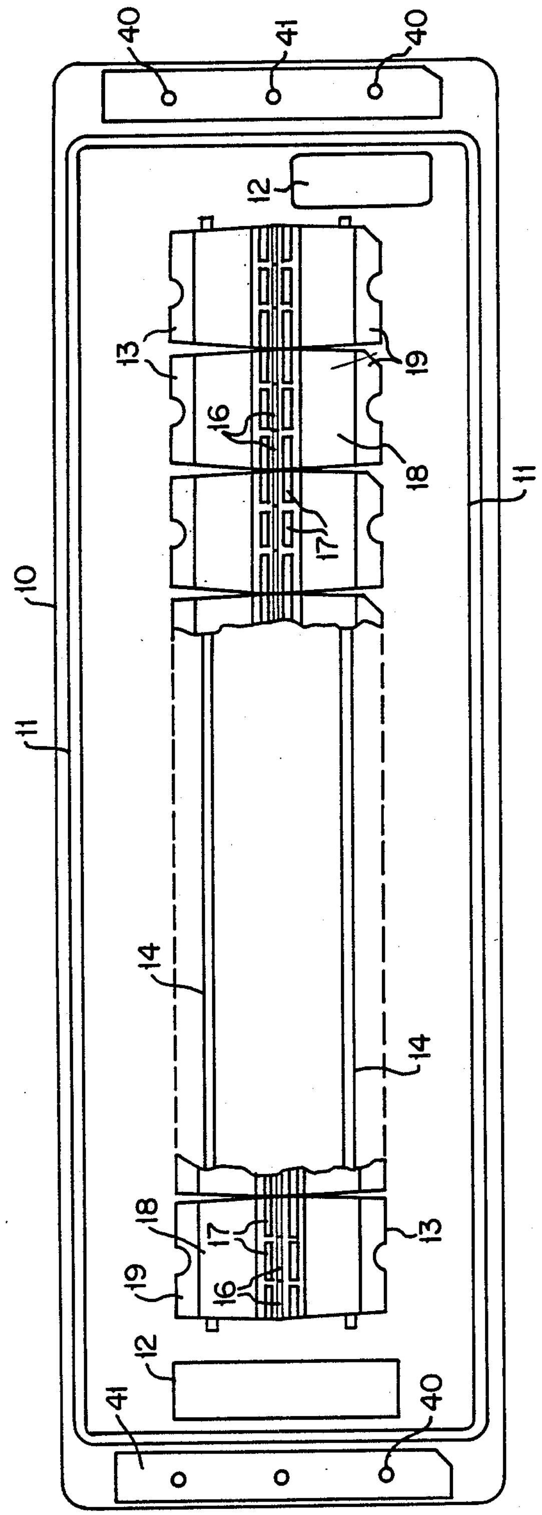
FIG. 1 is a plan view of the front face of an LED print head assembly constructed according to principles of this invention.

The philosophy involved in practice of this invention is to assemble the components of the print head on a precision fixture rather than to make a number of precise piece-parts. This makes a much less costly product than to manufacture all of the parts to high precision for obtaining a precisely dimensioned final product. The assembly comprises a mother plate with a plurality of daughter tiles adhesively bonded on the front of the mother plate. A plurality of dice, each containing a row of LEDs, are adhesively bonded on each tile. The lED dice are precisely made. A precision subassembly fixture is used to position the dice on each tile. The tiles are then inverted on a precision assembly fixture and the mother plate put on top. Assembling upside down makes it easy to align the parts and maintain the front face of LEDs in a straight flat line.

The foundation for the assembly of LEDs is an aluminum alloy mother plate 10 which can be fastened into a printer. The front face of the mother plate has a peripheral groove 11 which receives the edge of a cover (not shown) which supports a lens for focusing the image of the LEDs onto a photo-receptor drum or the like. Near each end of the mother plate there are conventional electrical connectors 12 for bringing signals and power into the assembly. The mother plate serves as a ground plane for the LEDs and integrated circuits mounted in the assembly.

Nine mounting tiles 13 are arranged in a row along the length of the mother plate. The tiles are secured to the front face of the mother plate by an electrically conductive silver-filled epoxy adhesive and a quick setting acrylic adhesive The electrically and thermally conductive adhesive is applied between a pair of parallel grooves 14 extending along the length of the plate. The acrylic adhesive is applied along the length of the plate between the lateral edge areas of the tiles and the mother plate outboard from the grooves 14. The grooves serve to isolate the two adhesives from each other.

A row of LED dice 16 lies along the center of the assembly. Each die is about eight millimeters long and about a millimeter in width. Three such dice are cemented to the front face of each of the tiles by an electrically conductive silver-filled epoxy adhesive. On each side of the row of LED dice on each tile, there is a row of three integrated circuit chips 17. Electronic signal processing is conducted on the integrated circuit chips for supplying a current to selected light emitting diodes, as desired, during operation of the assembly In an exemplary embodiment with 96 LEDs on each die, each chip has 48 integrated circuit LED current drivers for driving half of the LEDs on its respective die.

Outboard from the row of integrated circuit chips on each side of the center line, there is a conventional printed circuit board 18 cemented to the front face of each tile. Besides receiving electrical connections from the connectors 12, the printed circuit boards may also serve as mounting for trimming resisters, blocking capacitors, and other discrete components. Wire bonded electrical connections (not shown) are provided between the PC boards and the integrated circuit chips associated therewith. Similarly, wire bonded electrical connections are made between the chips and the LED dice. Electrical connections within the assembly are omitted from the illustration for clarity since they form no part of this invention.

The LEDs are precisely located on the dice by reason of the dice being carefully cut after the LEDs are fabricated. The LED dice are then accurately positioned on the tiles. Finally, the tiles are accurately positioned on the mother plate. Thus, the LEDs are precisely positioned on the mother plate.

An exposed area 19 is left along each of the opposite lateral edges of each tile extending beyond the edge of the printed circuit board secured on the front face of the tile. These exposed areas on the front faces of the tiles are reference surfaces which are located in a reference plane by positioning them on a precision assembly fixture.

Figure 2:
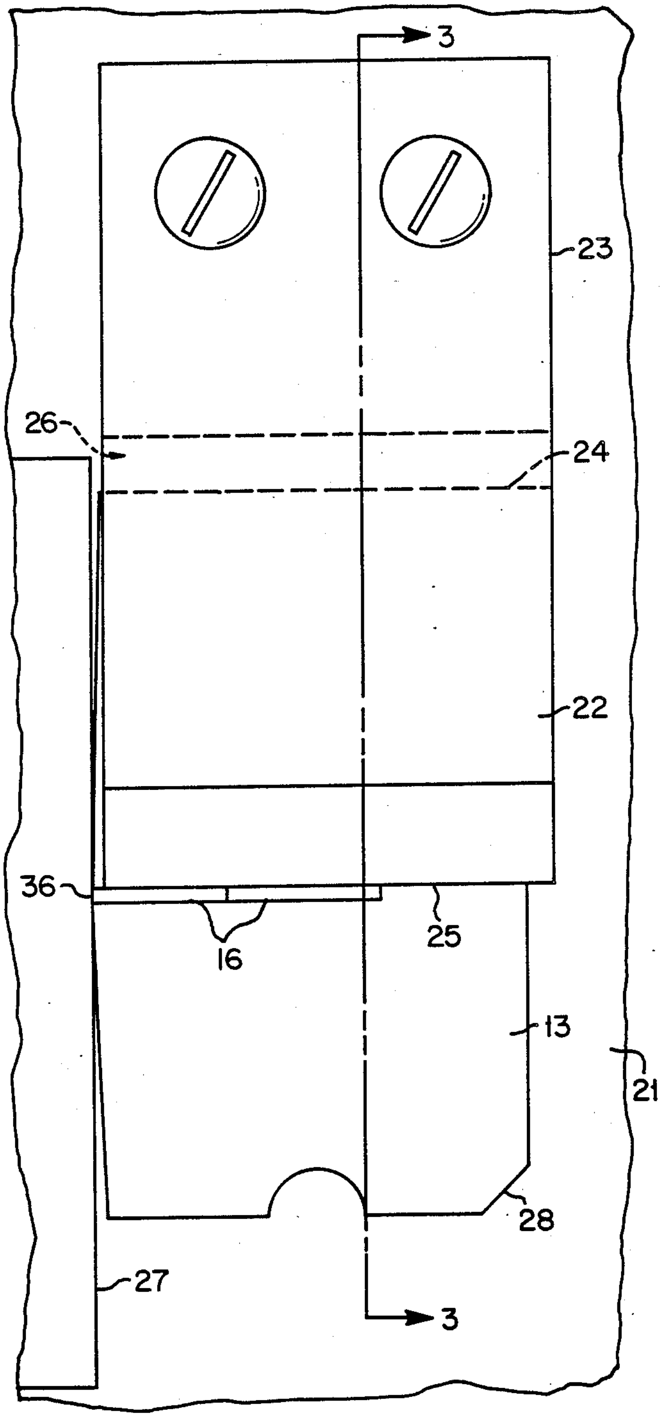
FIG. 2 is a fragmentary view of a subsystem assembly fixture.
Figure 3:
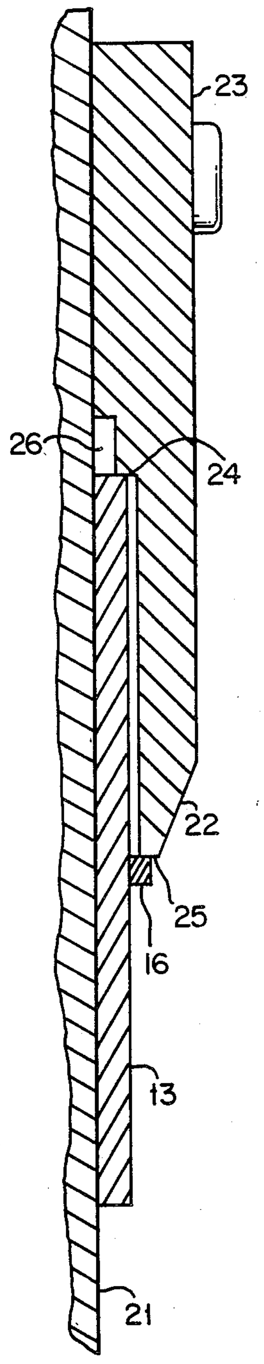
FIG. 3 is a fragmentary cross-section of the subsystem assembly fixture along line 3—3.

Since the tiles are precisely positioned in the assembly, it is important that the LED dice be correctly positioned on each tile. FIGS. 2 and 3 illustrate, in fragmentary face view and cross-section, a fixture for assembling the dice on a tile. The fixture has a smooth, flat base plate 21 on which a mounting tile 13 is placed. The tile slides under a cantilevered overhang 22 on an dice reference guide 23. The tile is placed on the base plate with its front face up and with one edge (defined as the reference edge) abutting a shoulder 24 under the overhang. An undercut 26 in the dice reference guide causes the shoulder 24 to abut just the front half of the reference edge of the tile.

It should be noted that the tiles are not precisely rectangular. It is desirable to have an almost unnoticeable chamfer on each side of the tile extending from the locus of the LED dice near the center of the tile toward each lateral edge. A chamfer of as little as 1° has been found appropriate.

A small flat 36 (not separately shown in the drawings) is left in the middle of the tile to serve as a reference point. The tapers make manufacturing easier. The critical dimension is the length of the LED array in the center portion of the tile. Thus, it is not necessary to maintain tight tolerances along the entire length of the tiles, but only in the area of the reference points or flats 36. One corner 28 of the tile on the opposite end from the reference surface is chamfered as a clear marker for proper orientation of the tile on the subassembly fixture, and later on the assembly fixture.

The tile is also placed in the assembly fixture so that the reference flat 36 on one side engages the edge of a side guide 27. The side guide is at precisely a right angle to the shoulder 24 on the dice reference guide which is in turn exactly parallel with the lip 25 on the overhang. The distance between the lip 25 and shoulder 24 is also precisely known. All of this assures that the tile is in a precisely known location with the reference edge of the tile abutted against the shoulder 24 throughout its length, and the center portion 36 of the side of the tile touching the side guide 27.

When the tile is in its proper location in the subassembly fixture, it can be temporarily held in place by a vacuum chuck (not shown) which simply applies a vacuum to the bottom face of the tile so that air pressure tightly holds it down.

At this point, a die 16 with a row of LEDs is placed with one edge against the lip 25 of the overhang and with an end against the side guide 27. This positions the die precisely with respect to the reference edge and one side of the tile. A second die is then placed with its edge against the lip of the overhang and its end abutting the end of the first die. A third die (not shown in FIG. 2) is then placed in an analogous location with an edge against the lip and its end against the end of the second die. The lip 25 aligns the three dice in a straight line parallel to and a known distance from the reference edge of the tile abutting the shoulder 24.

The LED dice are themselves made with precision. The LEDs are formed by conventional techniques on arrays of putative dice on relatively large wafers. After testing to reject defective areas on a wafer, the wafer is scribed and broken, or precision sawed, or both, to produce the individual dice. The saw or scribe lines are located precisely with respect to the line of LEDs on the die to be formed so that the LEDs are in known locations on the dice.

Before placing the tile in the subassembly fixture, three thin pads of conductive epoxy adhesive are screen printed on the front face of the tile at the location where the dice are to be placed. As the dice are placed, they are moved at 1 east a small distance laterally for assuring that the bottom surfaces are covered with adhesive and are pressed downwardly toward the tile for minimizing the thickness of adhesive between the dice and tile. The adhesive layer is of substantially uniform thickness and its theological properties are such that slight pressure on the die assures tight seating and a substantially uniform thickness of adhesive between the dice and tile.

The adhesive also serves to hold the dice in place on the tile when it is removed from the subassembly fixture for heat curing of the epoxy. An epoxy with high green strength assures the desired performance It is also desirable that the -adhesive, upon curing, leave a small gap between adjacent dice so that there is accommodation for the higher thermal expansion coefficient of the tiles than the coefficient of the GaAs of the LED dice. A suitable epoxy comprises Amicon C-850-5A available from the polymer Products Division of Amicon Corporation, Lexington, Mass.

After assembling the dice onto the tile substrate, the integrated circuit chips and printed circuit boards are also adhesively bonded to the tile. The dimensional tolerances for locating these parts is not as critical as that of locating the LED dice. After curing the adhesives, connection wires can be bonded between the LED dice and IC chips, and between the chips and PC boards in a conventional manner.

At this point, the tile subassembly can be thoroughly tested. Typically, this involves testing the LEDs at a power level greater than expected in service to "burn in" the assembly After "burn in" the tile can be tested for LED light output at a selected current, and the like. Testing at the subassembly stage can avoid loss of yield at the final assembly stage.

Figure 4:
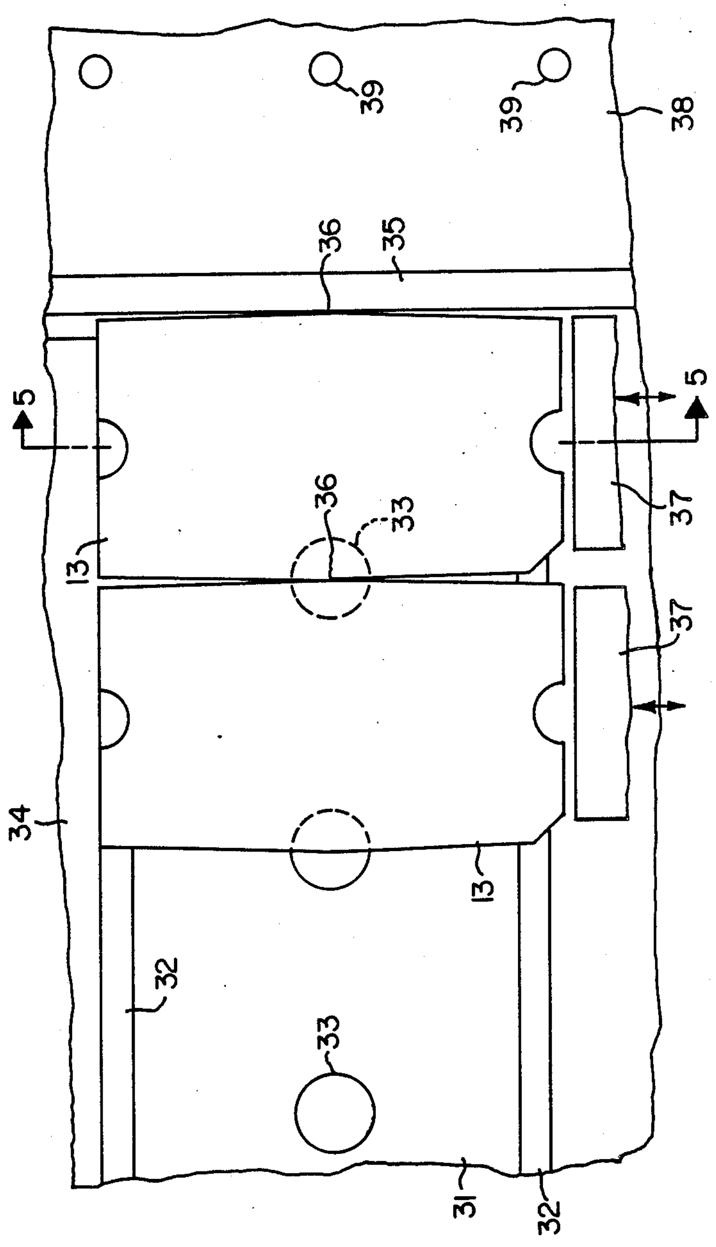
FIG. 4 is a fragmentary view of the face of an assembly fixture.
Figure 5:
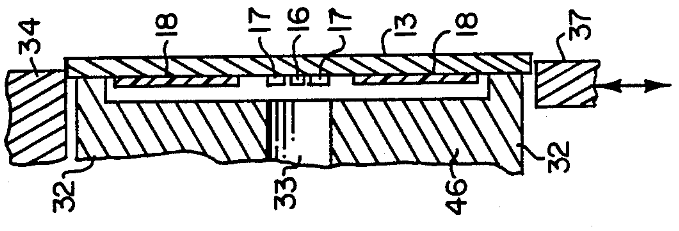
FIG. 5 is a fragmentary cross-section of the assembly fixture along line 5—5.

Final assembly is conducted on an assembly fixture as illustrated in a fragmentary face view and cross-section in FIGS. 4 and 5. In this fixture, a plurality of tiles 13 are assembled front face down on a broad U-shaped z-base 31. The z-base has a raised rail 32 extending along each edge. The tops of the rails are ground precisely flat and smooth to serve as a reference plane for fixing the z position of the front faces of the tiles. The tiles are placed with the exposed areas 19 at each lateral edge resting atop the rails.

The open channel of the z-base between the rails provides clearance for the PC boards 18, IC chips 17 and LED dice 16 on the front face of the tile, as can be best seen in FIG. 5. A row of holes 33 extend through the bottom of the z-base to permit viewing by a microscope (not shown) below the base. The holes are arranged so that the field of view includes the two sides of adjacent tiles.

A first mounting tile is set on the fixture with one lateral edge against an edge guide 34 extending parallel to the rails The same reference edge of the tile that was against the shoulder 24 (FIGS. 2 and 3) of the subassembly fixture is placed against the edge guide 34 of the assembly fixture. The edge guide 34 extends above the rails only the half thickness of the tiles so that it bears against the same part of the tile as the shoulder 24 on the subassembly fixture. The side of the first tile is located with the reference flat 36 in contact with a shoulder 35 perpendicular to the rails at the end of the fixture.

Once the tile is properly positioned against the edge guide 34 and end shoulder 35, with the exposed areas on the front face of the tile on the z direction positioning rails 32, it is clamped in position by a movable clamp 37 which bears against the lateral edge of the tile. Any of a variety of clamping mechanisms can be employed, including spring loading, a pneumatic actuator, solenoid, screw adjust, or the like.

After the first tile is positioned and clamped, a second tile is placed front face down on the rails with its lateral edge tight against the edge guide 34. The space between the LEDs on the end dice on adjacent tiles is viewed with a microscope (which is conveniently connected to a video display for ease of viewing), and the second tile moved until the appropriate spacing is obtained. The second tile is then clamped in place. This process is repeated for each successive tile to assemble the full array of nine tiles (twenty-seven dice). A small space between the end dice on adjacent tiles is desirable to accommodate the, greater thermal expansion of the aluminum mother plate than the stainless steel tiles.

When all of the tiles are assembled and clamped, the assembly can again be checked for proper spacing before the tiles are finally locked in position.

At each end of the assembly fixture, there is a surface 38 exactly coplanar with the tops of the rails 32. At least one, and as many as three, pins 39 protrude above that surface. Alternatively, the end surfaces 38 may be at a different, known elevation from the tops of the rails, or may be made adjustable for obtaining a desired Z dimension for the array of LEDs.

A reference tile 41 (FIG. 1) is placed on that surface and located by the pins, which engage holes 40 in the reference tiles. Alternatively, the reference tiles can be positioned by one pin and a shoulder for engaging an edge of the tile 41. Each of the reference tiles has the same thickness as the tile on which the LED dice are located. The pins provide x and y locations which can later be used as references for lenses, mounting fixtures and the like.

After all of the LED-bearing mounting tiles and reference tiles are in position on the assembly fixture and their positions have been verified, the mother plate is placed on top of the tiles and adhesively bonded thereto. Two types of adhesive are applied to the front face of the mother plate as mentioned hereinabove. An acrylic resin adhesive is applied on the front face of the mother plate outboard of the isolation grooves 14. An accelerator for the acrylic is applied on the corresponding areas on the backs of the tiles. A silver filled epoxy resin is applied on the mother plate between the grooves.

When the mother plate is laid on top of the tiles, the somewhat fluid adhesive accommodates variations in elevation of the backs of the tiles and surface flatness imperfections in the tiles by filling any gaps between the tiles and mother plate. The goal is to keep the LED top surfaces flat across the length of the array while keeping the manufacturing cost of the parts as low as possible.

This is accomplished by taking up the tolerances in the variable thickness of adhesive between the mother plate and daughter tiles. The filling of the space between the tiles and mother plate is also important to assure good thermal and electrical conductivity to the mother plate which serves as a heat sink and a ground plane.

The accelerator and acrylic adhesive react to obtain a fast cure of the adhesive at room temperature. This permits the assembly to be removed from the fixture within a matter of a minute or so. The assembly is then heated to the curing temperature of the conductive epoxy as the final stage of mechanical assembly.

By having the front faces of the tiles define a reference plane upon assembly on the rails, manufacturing constraints are relaxed for some of the components of the assembly. The only parts that need be made with precisely controlled thicknesses are the LED dice. The wafers from which these are made are lapped to a carefully controlled thickness so that the LEDs are substantially coplanar when assembled on the tiles.

Even though it is not necessary for precise positioning of the LED dice, it is desirable to keep the thickness tolerance of the tiles relatively tight so that the thickness of the conductive adhesive is close to being the same between all tiles and the mother plate. This minimizes differences in electrical resistance which might vary the light output from the LEDs.

The mounting tiles are made of stainless steel which receives thin electroless nickel plating and gold plating for preventing oxidation films that would increase electrical contact resistance. Resistance variations are to be avoided since these may affect the light output from the LEDs. Stainless steel is employed as a substrate since it has a coefficient of thermal expansion sufficiently close to the coefficient of expansion of the gallium arsenide LED dice and silicon integrated circuit chips to avoid breakage of these brittle components during low temperature excursions. Differences in coefficient of expansion are accommodated in the adhesive.

The mother plate is preferably made of aluminum alloy for lighter weight and better thermal and electrical conductivity. Differences in coefficient of expansion between the aluminum and stainless steel can be accommodated by the adhesives.

The holes 40 in the reference tiles at the ends of the assembly provide guidance for aligning the print head in a printer. The holes may be used as references for locating the x and y positions of the print head assembly. Since the front faces of the reference tiles are in precisely the same plane as the tiles on which the LED dice are positioned, the elevation or z position of a focusing lens for the LEDs, and of the print head in the printer can also be set. Either of these alignment or installation references may be complemented with additional adjustment features external to the print head assembly, if desired.

Figure 6:
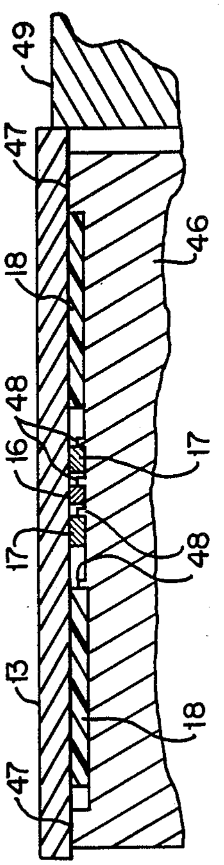
FIG. 6,/is a fragmentary cross-section of another embodiment of subsystem assembly fixture.

As an alternative to the assembly of LED dice on a tile as hereinabove described and illustrated in FIGS. 2 and 3, one may use an upside-down technique for the subassembly analogous to that for the final assembly. In such an embodiment, the assembly fixture may be as illustrated in fragmentary transverse cross section in FIG. 6.

This subassembly fixture comprises a base 46 having a recessed area having a raised reference face 47 at each end. The recessed area is subdivided into five shallow pockets by low walls 48. The two outer larger pockets accommodate printed circuit boards 18. Inwardly of the PC board pockets, two pockets accommodate rows of integrated circuit chips 17. In the center there is a small pocket which accommodates a row of LED dice 16.

The depth of the small pocket which accommodates the LED dice is precisely controlled so as to be a known distance below the reference plane formed by the two reference faces 47. This assures that the front face of the dice are a known distance above the front face of a tile. The depth of the other pockets is also controlled but need not be made to the same tolerance since the height of the IC chips and PC boards above the front face of the tile is not as critical.

In this embodiment, a row of LED dice are placed in the central pocket, front face down. One edge of each die is placed against one side wall of the pocket (to the right in FIG. 6). The end of the first LED die is pressed against one end of the pocket and the ends of the additional dice are abutted against the ends of the preceding dice. The integrated circuit chips are assembled in the fixture in the same manner, again abutting the side of each chip against an internal wall 48. The PC boards are similarly positioned in their respective pockets in the fixture.

A tile 13 receives a screen printed pattern of adhesive on its front face corresponding to the pattern of components to be mounted on the tile. This adhesive coated tile is then placed on top of the upside-down components in the subassembly fixture for adhesive bonding. The reference lateral edge of the tile is abutted against an edge reference guide 49, thus assuring that all of the components mounted on the tile are correctly positioned. The adhesive between the tile and components accommodates variations in height of the components in the assembly fixture. If desired, the LED dice and integrated circuit chips may be assembled on a tile in such a fixture for precise positioning and the printed circuit boards later added in a separate operation.

Although limited embodiments of LED print head assembly have been described and illustrated herein, it will be understood that many modifications and variations are possible. For example, linear fixtures have been described and illustrated herein in the form of straight edges against which tiles, dice, or the like are placed. It will be recognized that it is not necessary to have a continuous straight edge to form a linear fixture and in fact only two points are required to form a linear fixture. Such a two point fixture is more susceptible to damage than a straight edge as described and is therefore less preferred. It will also be apparent that the planar fixtures may be interrupted with grooves or the like, much in the same way the rails on the assembly fixture are spaced apart from each other. Interrupted planar fixtures such as the rails are useful in an embodiment where the tiles have areas on the front which are to be placed against the planar fixture, and which do not extend the complete length of each lateral edge. For example, reference areas may be left on the front of the tile near each corner, with a printed circuit board extending closer to the edge in a mid portion.

In the preferred embodiment, conductive adhesive is used between the tiles and the LED dice and between the tiles and the mother plate so that the latter serves as a ground plane. Electrically insulating adhesive may be used with the ground made through a printed circuit board. Thus, the invention may be practiced otherwise than as specifically described.

What is claimed is:

1. A method for assembling a row of LED dice on a print head comprising the steps of:

placing a row of the LED dice on the front face of a flat tile with the cleaved edges a predetermined distance from one lateral edge o the tile;

adhesively bonding to the dice to the front face of the tile with the LED faces of the dice substantially coplanar;

placing a row of tiles with the front face of each tile on a planar fixture and with one lateral edge of each tile against a linear fixture; and adhesively bonding a mother plate to the back face of the row of tiles while on the fixture.

2. A method as recited in claim 1 comprising adhesively bonding the mother plate to the tiles with a relatively faster curing adhesive along lateral edges of the tiles and with a relatively slower, electrically conductive adhesive on a mid-portion of the tiles.

3. A method as recited in claim 1 comprising:

placing a reference tile at each end of the row of tiles with a front face against the planar fixture; and adhesively bonding the reference tiles to the mother plate while on the fixture.

4. A method as recited in claim 1 wherein the tiles are metal and the dice are bonded to the tiles with an electrically conductive adhesive.

5. A method as recited in claim 1 wherein the step of placing the dice on the tile comprises placing the edges of the dice against a first linear fixture while the tile has a lateral edge against a second linear fixture parallel to the first linear fixture and spaced a predetermined distance from the first linear fixture.

6. A method as recited in claim 5 where the dice are placed on the tile with the end of one of the dice against a side guide while the side of the tile is against the same side guide.

7. A method as recited in claim 1 wherein the tiles are placed front face down on the assembly fixture and the mother plate is placed on top of the tiles with adhesive between the mother plate and the tiles.

8. A method for assembling an LED print head comprising the steps of:

placing a row of light emitting diodes across a tile a predetermined distance from one lateral edge of the tile, leaving at least portions of the front face of the tile uncovered;

placing a row of such tiles with uncovered portions of the front face engaging a planar fixture and with the lateral edge against a linear fixture; and adhesively bonding a mother plate to the back faces of the tiles while on the fixture.

9. A method as recited in claim 8 wherein the tiles are placed on the planar fixture with their front faces down and the mother plate is placed on top of the tiles on the fixture.

10. A method as recited in claim 8 comprising adhesively bonding the mother plate to the tiles with a relatively faster curing adhesive on one portion of the tiles and with a relatively slower, electrically conductive adhesive on another portion of the tiles behind the light emitting diodes.

11. A method as recited in claim 8 comprising:

placing a reference tile at each end of the row of tiles with a front face against the planar fixture; and adhesively bonding the mother plate to the reference tiles at the same time as to the tiles with light emitting diodes.

12. A method as recited in claim 8 wherein the step of placing the light emitting diodes on the tile comprises placing the edges of dice having rows of light emitting diodes against a first linear fixture and placing a lateral edge of the tile against a second linear fixture parallel to the first linear fixture and spaced a predetermined distance from the first linear fixture.

13. A method as recited in claim 12 wherein the second linear fixture comprises a shoulder under an overhang and the first linear fixture comprises a lip on the overhang, and comprising placing the tile under the overhang front face up, and placing the dice front face up on top of the tile.

* * * * *

UNITED STATES PATENT AND TRADEMARK OFFICE
CERTIFICATE OF CORRECTION

PATENT NO. : 4,942,405

DATED : July 17, 1990

INVENTOR(S) : Joseph W. Dody, Richard J. Klinke, Christopher A. Lowery, Vera D. Vallentin-Price, Gary D. Sasser, William P. Sullivan, Michael Bertagne It is certified that error appears in the above-identified patent and that said Letters Patent is hereby corrected as shown below:

ON THE TITLE PAGE:

Field [75], Inventors, change "Jospeh W. Dody" to --Joseph W. Dody--, and add inventor's name --Michael Bertagne, Bristol, England--, which was inadvertently left out.

Column 2, line 5, change "!ED" to --LED--;
line 27, change "o f" to --of--;
line 63, change "6,/is" to --6 is--;
Column 3, line 8, change "lED" to --LED--;
line 47, change "assemblyIn" to --assembly. In--;
Column 5, line 14, change "at l east a" to --at least a--;
line 9, change "theological" to --rheological--;
line 26, change "performanceIT" to --performance. It--;
line 32, change "polymer" to --Polymer--;
line 45, change "assemblyAfter" to -- assembly. After--;
Column 6, line 29, change "the, greater" to --the greater--;
Column 9, line 3, omitted from Claim 1, add "cutting each LED die along`an edge a predetermined distance from a reow of light emitting diodes on the die;"

Field [57], change "copolanar" to --coplanar--.

Signed and Sealed this

Twenty-eighth Day of July, 1992

*Attest:*

DOUGLAS B. COMER

*Attesting Officer*

*Acting Commissioner of Patents and Trademarks*